US007094075B1

(12) United States Patent
Lim et al.

(10) Patent No.: US 7,094,075 B1
(45) Date of Patent: Aug. 22, 2006

(54) ELECTRICAL CONNECTOR WITH A DETACHABLE HOOD

(75) Inventors: Chin Hua Lim, Singapore (SG); Wee Ling Liang, Singapore (SG); Lee Yin Chuang, Singapore (SG); Akira Nagamine, Aichi-ken (JP)

(73) Assignees: MEA Technologies Pte. Ltd., Singapore (SG); J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 11/189,055

(22) Filed: Jul. 25, 2005

(30) Foreign Application Priority Data

Jun. 15, 2005 (SG) ............................ 2005-03840-1

(51) Int. Cl.
*H01R 12/00* (2006.01)
*H05K 1/00* (2006.01)

(52) U.S. Cl. ........................................ 439/79; 439/76.1

(58) Field of Classification Search .................. 439/79, 439/247, 572, 76.1
See application file for complete search history.

(56) References Cited

U.S. PATENT DOCUMENTS 5,265,322 A * 11/1993 Fisher et al. .................. 29/848
5,593,319 A * 1/1997 Ohno ......................... 439/587
6,183,276 B1 * 2/2001 Tsuji et al. ................. 439/157
6,702,593 B1 * 3/2004 Ogawa ........................ 439/79
6,773,272 B1 * 8/2004 Koehler et al. ............... 439/79
6,866,552 B1 * 3/2005 Koehler ...................... 439/892
6,926,540 B1 * 8/2005 Juntwait .................... 439/76.1
2004/0038564 A1 * 2/2004 Yan ........................... 439/76.1

FOREIGN PATENT DOCUMENTS

JP 06-052912 A 2/1994

OTHER PUBLICATIONS

Patent Abstracts of Japan; English Abstract of Publication No. 06-052912 A; 1 page.

* cited by examiner

*Primary Examiner*—Hae Moon Hyeon
(74) *Attorney, Agent, or Firm*—Osha Liang LLP

(57) ABSTRACT

A connector for mounting on a printed wiring board includes a housing, contact terminals disposed in the housing, a fixing member, and a hood detachably connected to the housing with the fixing member. The contact terminals each have a contact pin to contact a mating connector and a terminal portion to contact a wiring pattern on the printed wiring board. The hood includes a protruding portion having an insertion hole, whereas the housing includes a cavity to accommodate the protruding portion and a vertical hole, with which the insertion hole is communicated when the protruding portion is accommodated in the cavity. The fixing member includes a projected rod. The projected rod is inserted into the vertical hole and the insertion hole, thereby allowing the hood to be detachably attached to the housing.

8 Claims, 7 Drawing Sheets

PRIOR ART

ELECTRICAL CONNECTOR WITH A DETACHABLE HOOD

BACKGROUND OF THE INVENTION

1. Field of the Invention

The present invention relates to a connector mounted on a printed wiring board, more particularly to a connector for a printed wiring board mounted thereon, and provided contact terminals and hoods for covering the contact portions of the contact terminals installed in a housing.

2. Prior Art

A connector for a printed wiring board, whereby the connector provided with housing attached to contact terminals and hoods covering the contact portions of the contact terminals is mounted on the printed wiring board and placed in a solder bath, and the terminal portions of the contact terminals are connected by solder to conductive patterns of the wiring board through re-flow treatment, has been disclosed in Japanese Laid-Open Patent Publication No. 5-109444 before this application was filed.

The connector for a printed wiring board 40 described in the abovementioned laid-open patent publication is provided with a main body housing 41 made of insulating material (referred to as "Insulator" in the said publication) 42 and a metal hood (referred to as "Shield" in the same publication) 43 are integrally joined, a plurality of contacts 50 held by the insulator 42 in a linear arrangement, a compensation cover 49 that holds lead wires 51 of the contacts 50 likewise in a linear arrangement, and the assembly of these parts is attached to a printed wiring board P, as shown in FIG. 7.

The insulator 42 out of these constituent parts has a main body portion 44, and through holes into which the contacts 50 are installed are formed at the central portion and sidewall portions 46*a*, 46*b* which are formed on the right and left sides of the main body portion 44, respectively, while protrusions 47*a*, 47*b* for guiding insertion of the compensation cover 49 are also formed on the inner sides of both of the sidewall portions 46*a*, 46*b*. Further, positioning bosses (not shown) are formed on the bottom surface of the insulator 42.

Furthermore, the shield 43 consists of a hood portion 44*a* extending from the main body portion 44 to the insulator 42 in a joined state and right and left flange portions 44*b*, 44*b* where mounting screws are respectively formed on either side, and the hood portion 44*a* covers the contact portions of the contact terminals.

The connector is designed to be assembled and installed on the wiring board in the manner laid out in the following procedure.

Firstly, the plurality of contacts 50 is connected to the through holes of the insulator 42 installed with the contacts and which is integrally joined to the shield 43. Thereafter, the compensation cover 49 is attached to the insulator 42 to hold the lead wires 51 of the contacts 50 at predetermined positions in linear form.

The assembled connector 40 is mounted on the printed wiring board P, and the rear end of each lead wire 51 is thereby joined to the conductive patterns on the surface of the printed wiring board. At this point, the positioning bosses of the insulator 42 are inserted into the positioning holes of the printed wiring board P and the attaching position of the connector is thereby established. Thereafter, the connector is placed in a solder bath (not shown) and the terminal portions of the contact terminals are connected by solder to the conductive patterns of the board surface through the use of re-flow treatment.

In the connector disclosed in Japanese Patent Laid-Open No. 5-109444 publication, the insulator to which the contacts are installed and the shield covering the contacts are integrally joined, and the connector thereby formed is installed on the printed wiring board, with the terminal portions of the contacts being connected by solder to the conductive patterns on the board surface through the use of re-flow treatment.

Although the insulator and the shield of the connector are integrally joined, they are separately made of insulating material and metallic material, respectively, and comprise different members. As such, the following problems may likely occur in the assembly and repair of the connector, as well as during attachment to the printed wiring board, and the like.

(1) The connector cannot be placed in a solder bath when attached to the printed wiring board.

A solder bath is generally designed for connectors of a predetermined size. However, when the insulator and the shield are integrally joined, the outer shape of the connector is enlarged so it cannot fit the solder bath. Consequently, a large connector cannot be placed in such a generally designed solder bath. Although this problem may be addressed by installing a larger solder bath for larger connectors, this necessarily leads to higher facility costs, while making installation difficult. Additionally, using a large solder bath involves complicated management.

(2) Conducting repair work on the connector is difficult.

Connectors sometimes fail during use. Since the connector of the abovementioned prior art is such that the shield covering the contacts is integrally joined to the insulator, it is impossible to monitor the state of the contacts from the outside and determine the source of failure, and there are even cases where the failure cannot be properly addressed.

SUMMARY OF THE INVENTION

The present invention has been created in an attempt to solve the abovementioned problems of the prior art, and it is the object of the invention to provide a connector for a printed wiring board, where assembly and repair of the connector and its attachment to the printed wiring board is rendered easy.

To achieve such objective, the invention is designed as a connector for a printed wiring board, which consists of contact terminals having contact pins, to which another connector is connected at one end thereof in a contact manner, and terminal portions connected to another printed wiring board at the other end of the connector, a housing to which the contact terminals are installed, and hoods for covering the contact pins of the contact terminals, whereby the hoods are connected to the housing by freely detachable fixing means.

Moreover, it is preferable that the housing and the hoods be made of different material having varying characteristics, such that the housing is made of material with a high degree of heat resistance while the hoods are made of material with a low degree of heat resistance.

Further, it is preferable that the fixing means be disposed with protruding portions provided with insertion holes on the hoods, cavities into which the protruding portions of the hoods are inserted and vertical holes for communicating with the insertion holes of the hoods on the housing, and a fixing member having projected rods that are inserted into the vertical holes, and the insertion holes after the protruding portions of the hoods are inserted into the cavities of the housing, to which the hoods are affixed to the housing.

DETAILED DESCRIPTION OF THE PREFERRED EMBODIMENTS

Figure 1:
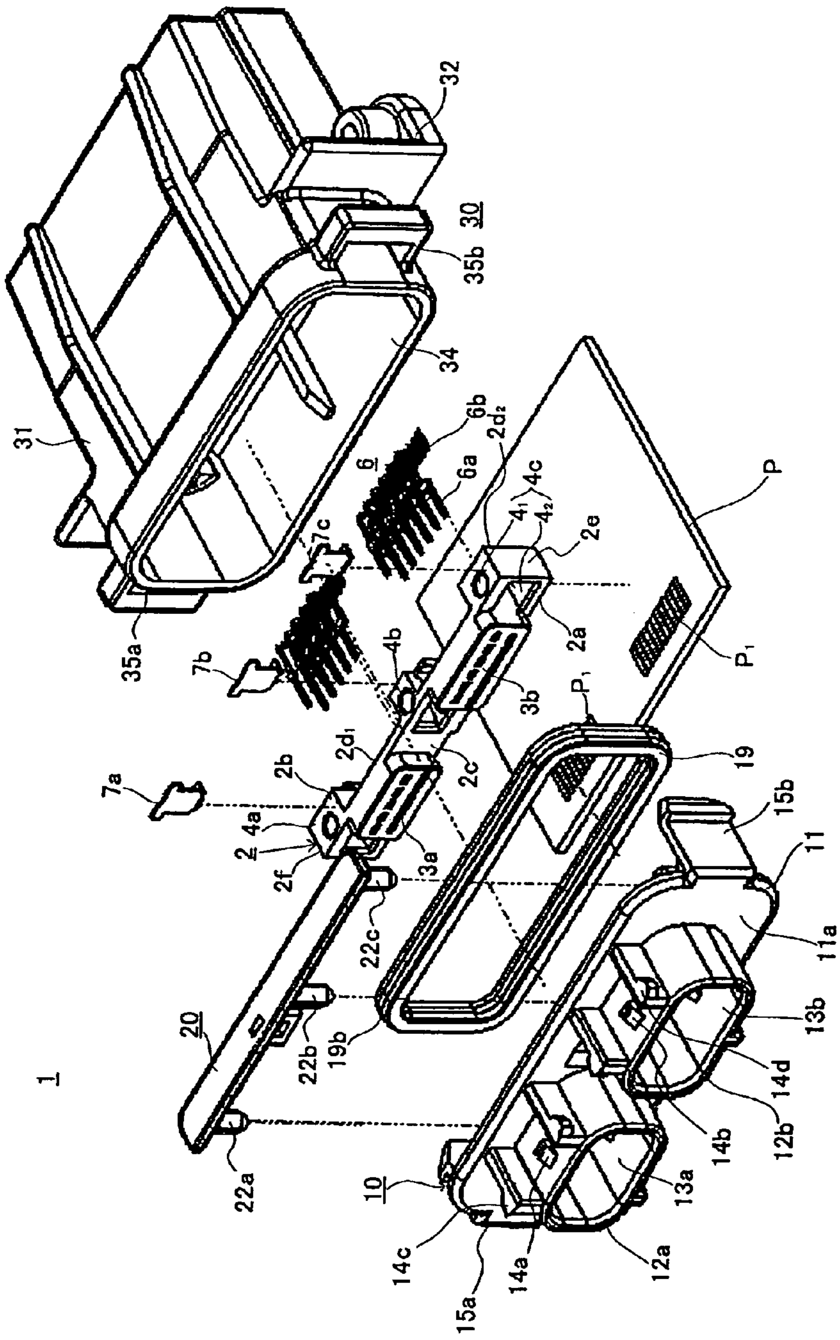
FIG. 1 is an exploded perspective view of a connector for a printed wiring board according to the embodiment of the present invention.

The preferred embodiments of the present invention will be explained hereafter with reference to the drawings. However, while the following description exemplifies the connector for a printed wiring board and embodies the technical concept of the present invention, the same is not intended to restrict the present invention to such type of connector for a printed wiring board. Other embodiments falling within the scope of the claims are also applicable to the present invention.

The connector 1 for a printed wiring board according to the embodiment of the present invention consists of a plurality of contact terminals 6, a housing 2 to which the contact terminals 6 are installed and which is mounted on the printed wiring board, a freely detachable front face cover 10 which is pre-assembled with a waterproofing seal 19 that is attached to the housing 2 and covers the contact terminals 6, and a fixing member 20 that affixes the housing 2 to the front face cover 10 sub-assembly. The connector 1 is housed in a device case 30 with a printed wiring board P after the connector 1 is assembled with the printed wiring board P.

Of these constituent parts, the housing 2 consists of a rectangular parallelepiped having a predetermined length, width, and height and made of synthetic resin. Since the housing is placed in a solder bath, it must be made of a material having high heat resistance such as synthetic resin.

The rectangular parallelepiped housing 2 includes a bottom surface 2*a*, a top surface 2*b*, a front surface 2*c*, a rear surface $\mathbf{2}d_1$ and $\mathbf{2}d_2$, and both end surfaces 2*e*, 2*f*, in which the bottom surface 2*a* is a mounting surface to be mounted on the printed wiring board P, and the top surface 2*b* is an attaching surface to which the fixing member 20 is installed. Two protruding portions 3*a*, 3*b* having a predetermined size and jutting forward are formed on the front surface 2*c*, while a plurality of attaching holes into which a plurality of contact terminals 6 is installed, is formed on each protruding portion in two rows (upper and lower rows).

Further, the housing 2 is provided on both ends and the central portion thereof with installing means 4*a*, 4*b*, 4*c*, for installing the fixing member 20. The installing means 4*a*, 4*b* and 4*c* are constituted by vertical holes $\mathbf{4}_1$ and cavities $\mathbf{4}_2$. For installing means 4*a* and 4*c*, vertical holes $\mathbf{4}_1$ penetrate top surface 2*b* to the inner surface of bottom surface 2*a*. For installing mean 4*b*, vertical hole $\mathbf{4}_1$ penetrates top surface 2*b* to the bottom surface 2*a*. Cavities $\mathbf{4}_2$ are formed from the front surface 2*c* to the inner surface of rear surface $\mathbf{2}d_2$. Projected rods 22*a* to 22*c* and protruding portions 18*a* to 18*c* are respectively inserted into the vertical holes $\mathbf{4}_1$ and the cavities $\mathbf{4}_2$ (refer to FIG. 1 and FIG. 4).

Figure 3:
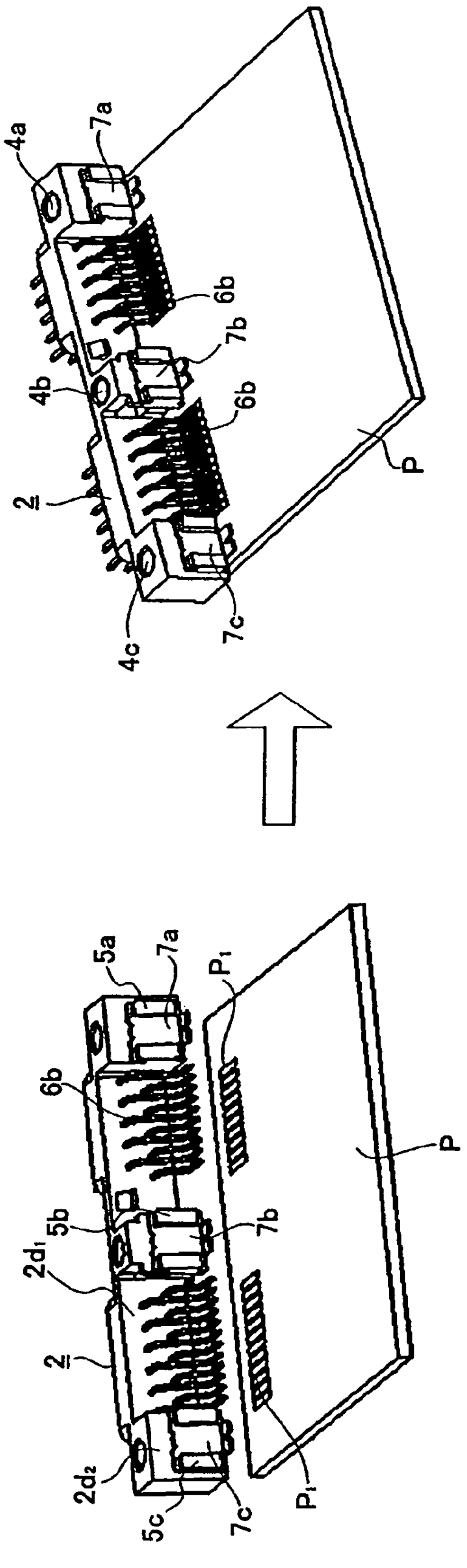
FIG. 3 is a perspective view illustrating the procedure for attaching the housing to a printed wiring board.

Furthermore, as shown in FIG. 3, concave grooves 5*a* to 5*c* to which each of the tabs 7*a* to 7*c* is installed, are formed on the rear surface $\mathbf{2}d_2$ of the housing 2.

The contact terminals 6, as shown in FIG. 1, have elongate rod-shaped bodies, and contact pins 6*a* at their tip and terminal portions 6*b* on the other end thereof, and are made of a metallic material having good electrical conductivity. The contact pins 6*a* are connected to the contacts of another connector (not shown), while the terminal portions 6*b* are connected by solder to a wiring pattern $P_1$ of the printed wiring board P.

Made of synthetic resin, the front face cover 10 is equipped with a pair of tubular hoods 12*a*, 12*b* for covering the contact pins 6*a* and locking portions 15*a*, 15*b* that are engaged with engaging portions 35*a*, 35*b* of the device case 30, and which are provided on a plate-shaped body 11 having a size fit to cover the opening portion 34 of the device case 30. The front face cover 10 may be made of material having low heat resistance since it is not placed in the solder bath. Further, the front face cover 10 may also serve a decorative purpose, by changing its color and shape for the device panel or the like to which the connector is installed. Further, the front face cover 10 should be made of a metallic material when electromagnetic shielding is required.

Each of the tubular hoods 12*a*, 12*b* consists of a tubular body having a predetermined length and an opening 13*a*, 13*b*, and is integrally molded onto the front surface 11*a* of the plate-shaped body 11. The openings of the tubular bodies are of a size similar to that of the two openings 17*a*, 17*b* that are formed on the rear surface 16*a*. Furthermore, the length of the tubular body is such that it covers the contact pins 6*a* when the contact terminals 6 are installed into the housing 2, to prevent the contact pins 6*a* from being bent even if the connector 1 main body hits an object because the tubular hoods 12*a*, 12*b* cover the contact pins 6*a*. In addition, locking portions 14*a*, 14*b* that are connected to another connector and guide protrusions 14*c*, 14*d* are provided on the outer circumference of each of the tubular hoods 12*a*, 12*b*.

In the rear surface 11*b* of the plate-shaped body (refer to FIG. 4), a projected portion 16 protruding from the rear surface 11*b* by a predetermined height and fitted into the opening of the device case 30, is formed, and the two openings 17*a*, 17*b* into which the protruding portions 3*a*, 3*b* of the housing 2 are fitted and the protruding portions 18*a*, 18*b*, 18*c* are severally formed on both end portions and the central portion on the surface 16*a* of the projected portion 16.

Each of the protruding portions 18*a* to 18*c* further juts out from the surface 16*a*, and has an outer shape with a size that fits into the cavities $\mathbf{4}_2$ of the housing 2. Several locking holes $\mathbf{18}_1$ are formed, penetrating from the top surface to the bottom surface of each of the protruding portions 18*a* to 18*c*.

Figure 2:
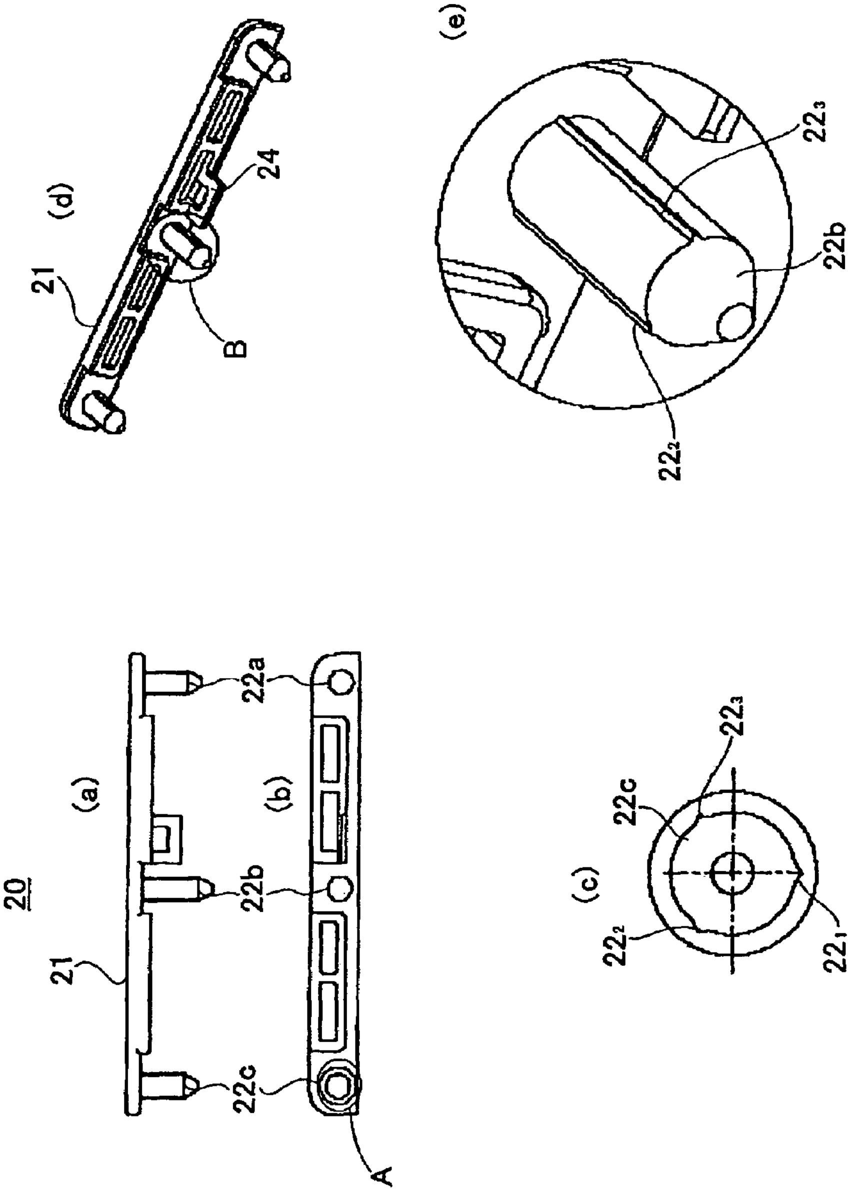
FIG. 2 shows a fixing member of FIG. 1, where FIG. 2(*a*) is the side view of the fixing member, FIG. 2(*b*) is the back view of the fixing member, FIG. 2(*c*) is an enlarged view of the portion marked A of FIG. 2(*b*), while FIG. 2(*d*) is a perspective of the of the fixing member viewed from the back thereof, and FIG. 2(*e*) is an enlarged view of B portion of FIG. 2(*d*).

Made of synthetic resin, the fixing member 20 consists of an elongate band-shaped piece 21 having a predetermined width and length, as shown in FIG. 2. The width of the fixing member 20 is the same as that of the top surface 2*b* of the housing 2, and its length is substantially the same as that of the housing 2.

The band-shaped piece 21 has a flat front surface and three projected rods 22*a* to 22*c* are formed on the rear surface thereof. Each of the projected rods 22*a* to 22*c* is provided with an attaching position where each rod is inserted into the vertical hole $\mathbf{4}_1$ of the installing means 4*a* to 4*c* of the housing 2, having a size with which it can be inserted into each hole. Incidentally, it is preferable that three convex fin protrusions $\mathbf{22}_1$ to $\mathbf{22}_3$ are provided on each projected rod 22*a* to 22*c* as shown in FIG. 2(*c*). By providing such protrusions, the projected rods can be pressed into each hole $\mathbf{4}_1$ of installing means of 4*a* to 4*c* of housing 2 and hole $\mathbf{18}_1$ of the projected portions 18*a* to 18*c* of the front face cover 10 and firmly fixed.

Figure 6:
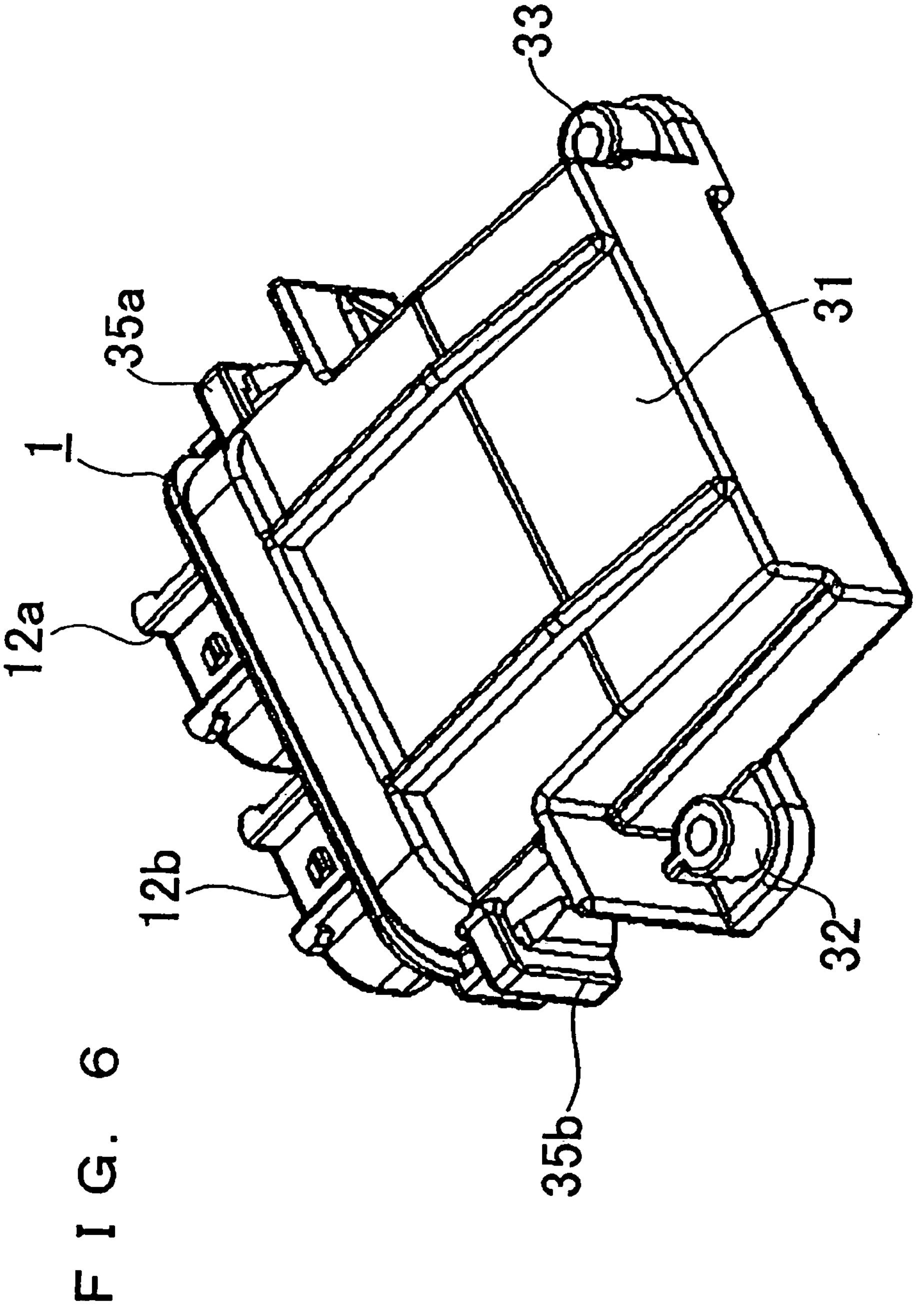
FIG. 6 is a perspective view showing the state where a connector installed to the printed wiring board is housed and installed in a device case.
Figure 7:
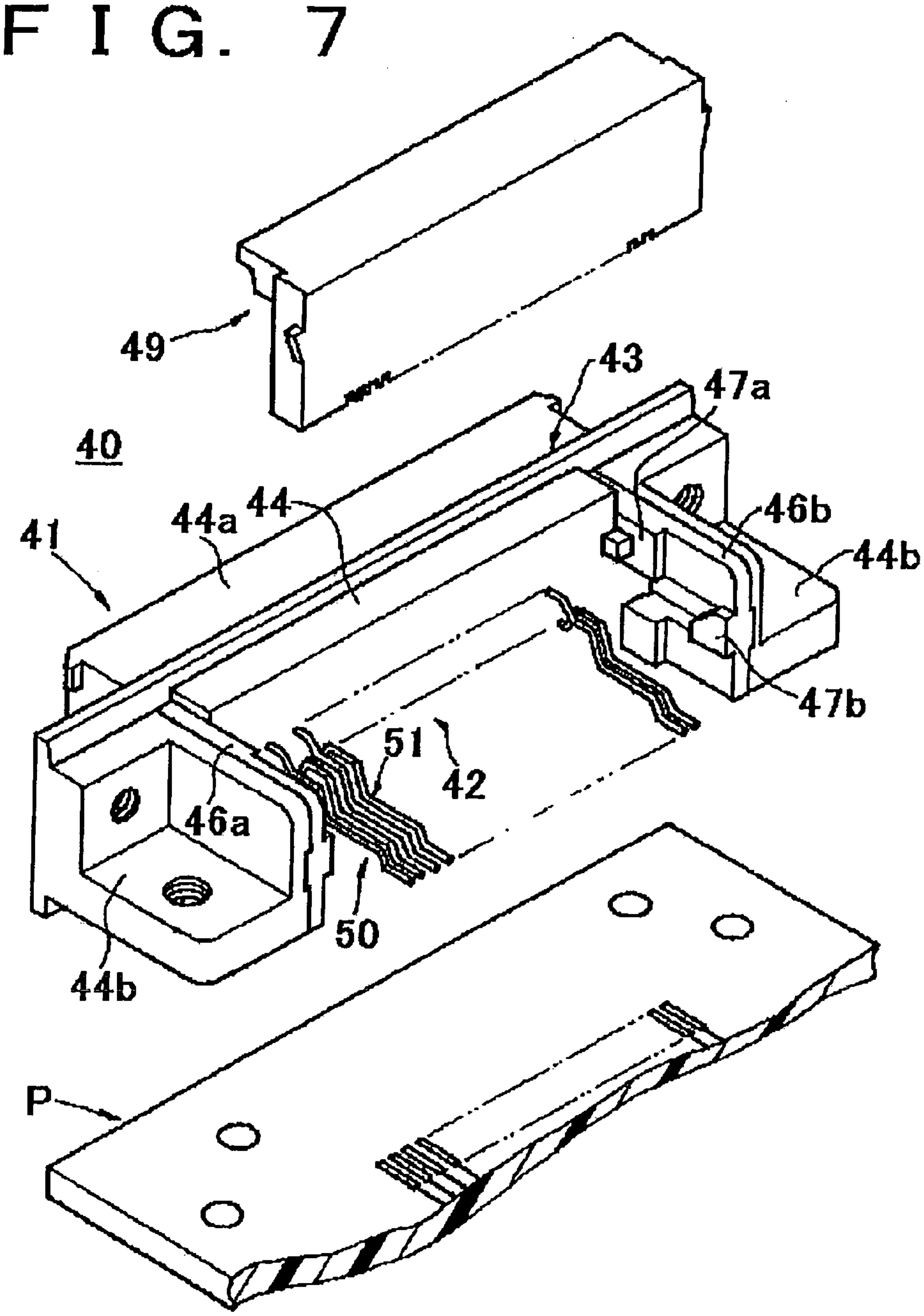
FIG. 7 is a perspective view showing a connector of prior art.

The device case 30, which is likewise made of synthetic resin, consists of a flat box body 31 that has an opening portion 34 in front and a base as shown in FIG. 1. The size of the opening portion 34 is such that it is covered by the front face cover 10. Engaging portions 35*a*, 35*b* are formed at opposite positions near the opening portion 34, and, at positions remote from the location of the engaging portions 35*a*, 35*b*, flanges 32, 33 to be attached to the device panel or the like are formed on both sides of the device case 30, as shown in FIGS. 1 and 6. The engaging portions 35*a*, 35*b* are engaged with the locking portions 15*a*, 15*b* of the front face cover 10.

The manner of assembling the connector and attachment to the printed wiring board will be described hereafter with reference to FIGS. 3 to 6.

As shown in FIG. 3, first, the contact terminals 6 and the tabs 7*a* to 7*c* are attached to the housing 2, while the terminal portions 6*b* of the contact terminals 6 are mounted on wiring patterns $P_1$, $P_1$ on the printed wiring board P such that the terminal portions contact the patterns, and are affixed to the board through another fixing means (not shown). After it is affixed to the printed wiring board P, the housing 2 is placed in the solder bath (not shown), and the terminal portions 6*b*, 6*b* of the contact terminals 6 are connected by solder to the wiring patterns $P_1$, $P_1$ by means of re-flow treatment. At this point, since the front face cover 10 is not yet attached to the housing 2, solder work can be easily accomplished, using a small solder bath. In other words, when the front face cover is removed, the assembly is lightweight and not bulky, facilitating handling and solder work, and since the connector is merely in a housing state, a small solder bath may be used to put the connector in place.

Figure 4:
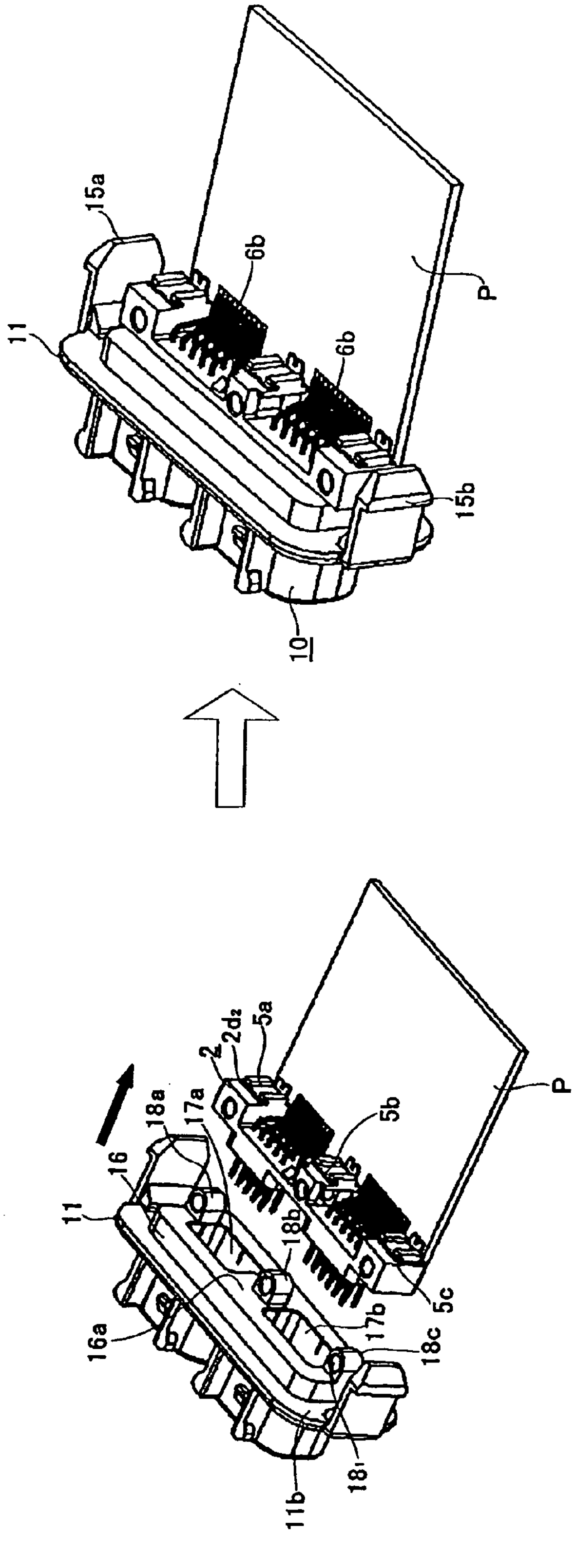
FIG. 4 is a perspective view illustrating the procedure for attaching the front face cover to the housing.
Figure 5:
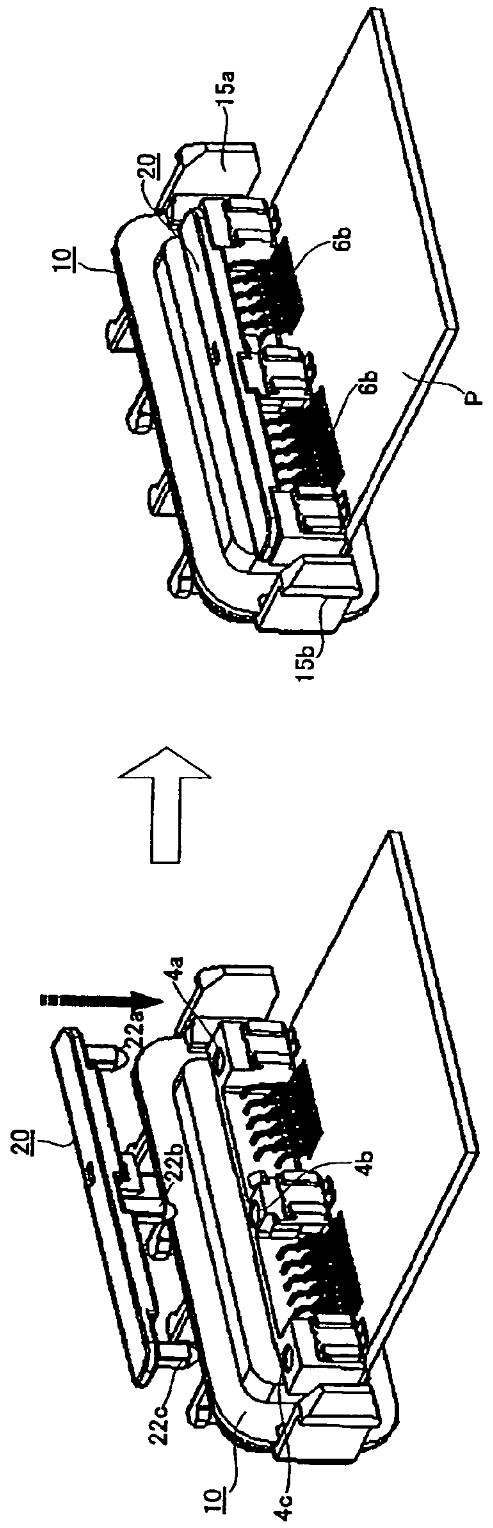
FIG. 5 shows the procedure for locking the front face cover to the housing by a detachable fixing means.

Next, the front face cover 10 is attached to the housing 2 that has been mounted on the printed wiring board P. As shown in FIGS. 1, 4 and 5, the projected portions 3*a*, 3*b* on the front surface 2*c* of the housing 2 are fitted into the openings 17*a*, 17*b* of the front face cover 10. Simultaneously, each protruding portion 18*a* to 18*c* of the front face cover 10 is inserted into the cavities 42 of the installing means 4*a* to 4*c* of the housing 2.

Thereafter, the front face cover 10 is affixed to the housing 2 by means of the fixing member 20 by inserting the projected rods 22*a* to 22*c* of the fixing member 20 into the vertical holes $\mathbf{4}_1$ of the installing means 4*a* to 4*c* on the housing 2 respectively and the holes $\mathbf{18}_1$ of the protruding portions 18*a* to 18*c* on the front face cover 10 (refer to FIGS. 1, 4 and 5). At this point, it is preferable to press the projected rods 22*a* to 22*c* into the respective holes by utilizing the convex fin protrusions $\mathbf{22}_1$ to $\mathbf{22}_3$ on each such rod. By pressing the rods in the holes, connection between the housing and the front face cover becomes firm.

Further, since the projected rods are attached to the fixing member 20 as to be freely detachable, the fixing member and other components can be easily disassembled for troubleshooting or replacement if they fail.

The connector that has been assembled in the manner described above is thereafter housed in the device case 30 by inserting it into the opening portion 34 as to allow the locking portions 15*a*, 15*b* of the front face cover 10 to engage with the engaging portions 35*a*, 35*b* of the device case 30 (refer to FIGS. 1 and 6).

According to the present invention, the hoods for covering the contact pins of the contact terminals are affixed to the housing through a fixing means as to be freely detachable, such that assembly and repair of the connector and its attachment to the printed wiring board can be performed without the hoods being in place, making it possible for the invention to effect the following.

At the time of assembly, when the contact terminals are installed to the housing with the hoods removed and the terminal portions are connected to the printed wiring board by soldering, the connector can be placed in the solder bath for re-flow treatment, and soldering can be easily performed, using a small solder bath. Specifically, the connector is lightweight and not bulky when the hoods are not in place, facilitating handling and soldering. In addition, since the connector is merely in the housing state, a small solder bath may be used to put the connector in place.

Further, since the contact pins of the contact terminals of the connector of the present invention are exposed before the hoods are installed, certain defects can already be detected during assembly, such as deformation of the contact pins. Additionally, repair, replacement or the like becomes easy because the hoods can be easily removed even after installation.

Furthermore, according to the embodiment of the present invention, the housing and the hoods can be separately made of different materials. For instance, appearance of the connector is enhanced when the color or shape of the hoods matches that of the device case or the like to which the connector is installed. In addition, since the hoods are not placed in the solder bath, they can be made of inexpensive material having low heat resistance. In this case, since only the housing of the connector must be made of a material with high heat resistance as would require expense outlay, a relatively inexpensive connector, from the viewpoint of the entire assembly can be constructed.

Still further, according to another aspect of the present invention, the fixing means comprises the protruding portions provided with insertion holes on the hoods, the cavities into which the protruding portions of the hoods are inserted and the vertical holes for communicating with the insertion holes of the hoods on the housing, and the fixing member having projected rods that are inserted into the vertical holes, such that the use of the fixing means facilitates the installation and separation of the housing to and from the hoods.

What is claimed is:

1. A connector, comprising:

a plurality of contact terminals each having a contact pin arranged to be in contact with another connector at one end thereof and a terminal portion arranged to be in contact with the printed wiring board at the other end thereof;

a housing in which the plurality of contact terminals are disposed, wherein the housing includes a vertical hole;

at least one hood configured to cover the plurality of contact pins of the plurality of contact terminals, wherein the at least one hood includes an insertion hole; and a fixing member having a projected rod configured to be inserted into the vertical hole and the insertion hole to detachably connect the at least one hood and the housing.

2. The connector according to claim 1, wherein the housing and the plurality of hoods are made of materials having different characteristics.

3. The connector according to claim 2, wherein the housing is made of material with high heat resistance and the plurality of hoods are made of material with low heat resistance.

4. The connector according to claim 1, wherein the at least one hood comprises a protruding portion that protrudes from a rear surface thereof in a direction in which the at least one hood connects the housing, wherein the insertion hole is disposed on the protruding portion.

5. The connector according to claim 4, wherein the housing includes a cavity configured to accommodate the protruding portion.

6. The connector according to claim 5, wherein the vertical hole is configured to communicate with the insertion hole when the protruding portion is accommodated in the cavity.

7. The connector according to claim 1, wherein the projected rod comprises a convex fin protrusion extending in an axial direction thereof.

8. A connector for a printed wiring board, comprising:

a plurality of contact terminals each having a contact pin arranged to be in contact with another connector at one end thereof and a terminal portion arranged to be in contact with the printed wiring board at the other end thereof;

a housing in which the plurality of contact terminals are disposed;

at least one hood for covering the plurality of contact pins of the plurality of contact terminals; and a detachable fixing mechanism configured to be detachably connect the at least one hood and the housing, wherein the detachable fixing mechanism comprises:

a plurality of protruding portions provided with a plurality of insertion holes on the at least one hoods;

a plurality of cavities into which the plurality of protruding portions of the at least one hood are inserted;

a plurality of vertical holes for communicating with the plurality of insertion holes of the at least one hood on the housing, and a fixing member having a plurality of projected rods that are inserted into the plurality of vertical holes, wherein the plurality of projected rods are inserted into the plurality of vertical holes and the a plurality of insertion holes after the plurality of protruding portions of the at least one hood are inserted into the plurality of cavities of the housing such that the at least one hood is affixed to the housing.

* * * * *